United States Patent
Liu et al.

(10) Patent No.: US 10,580,765 B1
(45) Date of Patent: Mar. 3, 2020

(54) SEMICONDUCTOR STRUCTURE FOR ELECTROSTATIC DISCHARGE PROTECTION

(71) Applicant: NANYA TECHNOLOGY CORPORATION, New Taipei (TW)

(72) Inventors: Fang-Wen Liu, New Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/207,185

(22) Filed: Dec. 2, 2018

(51) Int. Cl.
*H01L 27/02* (2006.01)
*H01L 27/06* (2006.01)

(52) U.S. Cl.
CPC ...... *H01L 27/0248* (2013.01); *H01L 27/0623* (2013.01)

(58) Field of Classification Search
CPC ............. H01L 27/0248; H01L 27/0623; H01L 27/0262
See application file for complete search history.

(56) References Cited

U.S. PATENT DOCUMENTS

| | | | | |
|---|---|---|---|---|
| 4,762,802 A | * | 8/1988 | Parrillo | H01L 21/263 438/220 |
| 5,012,317 A | * | 4/1991 | Rountre | H01L 27/0262 257/154 |
| 5,072,273 A | * | 12/1991 | Avery | H01L 27/0248 257/109 |
| 5,274,262 A | * | 12/1993 | Avery | H01L 27/0248 257/362 |
| 5,400,202 A | * | 3/1995 | Metz | H01L 27/0251 361/111 |
| 8,390,070 B2 | * | 3/2013 | Chen | H01L 27/0262 257/141 |
| 10,192,863 B2 | * | 1/2019 | Edwards | H01L 27/0262 |
| 2003/0179523 A1 | * | 9/2003 | Kodama | H01L 27/0262 361/56 |

(Continued)

FOREIGN PATENT DOCUMENTS

| | | |
|---|---|---|
| TW | 201428927 A | 7/2014 |
| TW | 201528516 A | 7/2015 |
| TW | 201810596 A | 3/2018 |

OTHER PUBLICATIONS

Charvaka Duvvury et al., "A synthesis of ESD input protection scheme," Journal of Electrostatics, p. 1-19, 1992 Elsevier.

*Primary Examiner* — Syed I Gheyas
(74) *Attorney, Agent, or Firm* — CKC & Partners Co., LLC

(57) ABSTRACT

A semiconductor structure includes a silicon control rectifier (SCR) region and a NPN region adjacent to the SCR region. The silicon control rectifier (SCR) region includes a first p-well region, a first n-well region surrounded by the first p-well region and a first P+ region in the first p-well region and spaced apart from the first n-well region. The NPN region includes a second p-well region, a first N+ region, a second N+ region and a second P+ region. The first N+ region is coupled to the second p-well region and an electrostatic discharge source. The second N+ region is coupled to the second p-well region and spaced apart from the first N+ region. The second P+ region is disposed in the second p-well region and equipotentially connected to the first P+ region in the first p-well region.

10 Claims, 4 Drawing Sheets

(56) References Cited

U.S. PATENT DOCUMENTS

2005/0057866 A1* 3/2005 Mergens ............. H01L 27/0262
  361/56
2013/0307017 A1* 11/2013 Chen ................... H01L 27/0262
  257/133

* cited by examiner

SEMICONDUCTOR STRUCTURE FOR ELECTROSTATIC DISCHARGE PROTECTION

BACKGROUND

Field of Invention

The present invention relates to a semiconductor structure for electrostatic discharge (ESD) protection.

Description of Related Art

Integrated circuits have progressed to advanced technologies with smaller feature sizes. As the feature size decreases, the possibility of damage from electrostatic discharge (ESD) increases. Electrostatic discharge (ESD) is usually characterized by fast transient high voltage discharge. An ESD event can occur in electrical circuits, such as an integrated circuit.

Recently, silicon control rectifier (SCR) devices are widely used in ESD protection circuit. However, the turn-on voltage of a conventional SCR device is about 20 V, which exceeds the breakdown voltage of a low-voltage device. In order to meet the demand for low-voltage devices, it is important to lower the turn-on voltage of SCR devices.

SUMMARY

The invention provides a semiconductor structure including a silicon control rectifier (SCR) region and a NPN region proximate the SCR region. The SCR region and the NPN region are formed in a semiconductor substrate. The silicon control rectifier (SCR) region includes a first p-well region, a first n-well region surrounded by the first p-well region and a first P+ region in the first p-well region and spaced apart from the first n-well region. The NPN region includes a second p-well region, a first N+ region, a second N+ region and a second P+ region. The first N+ region is coupled to the second p-well region and an electrostatic discharge source. The second N+ region is coupled to the second p-well region and spaced apart from the first N+ region. The second P+ region is disposed in the second p-well region and equipotentially connected to the first P+ region in the first p-well region.

According to an aspect of the present invention, the SCR region further includes a third P+ region disposed in the first n-well region and coupled to the electrostatic discharge source.

According to an aspect of the present invention, the third P+ region is equipotentially connected to the first N+ region.

According to an aspect of the present invention, the NPN region further includes a first halo implant region directly coupled to the first N+ region, in which the first halo implant region is p-type.

According to an aspect of the present invention, the NPN region further includes a second halo implant region directly coupled to the second N+ region, in which the second halo implant region is p-type.

According to an aspect of the present invention, the semiconductor structure further includes a second n-well region disposed between the SCR region and the NPN region.

According to an aspect of the present invention, the semiconductor structure further includes a metal line equipotentially interconnecting the second P+ region with the first P+ region.

According to an aspect of the present invention, the SCR region further includes a third N+ region disposed in the first p-well region and coupled to a ground node.

According to an aspect of the present invention, the SCR region and the NPN region are configured to form a first electrostatic discharge (ESD) current path from the electrostatic discharge source to the third N+ region through the second p-well region of the NPN region.

According to an aspect of the present invention, the SCR region and the NPN region are configured to form a second electrostatic discharge (ESD) current path from the electrostatic discharge source to the third N+ region through the first n-well region of the silicon control rectifier (SCR) region.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
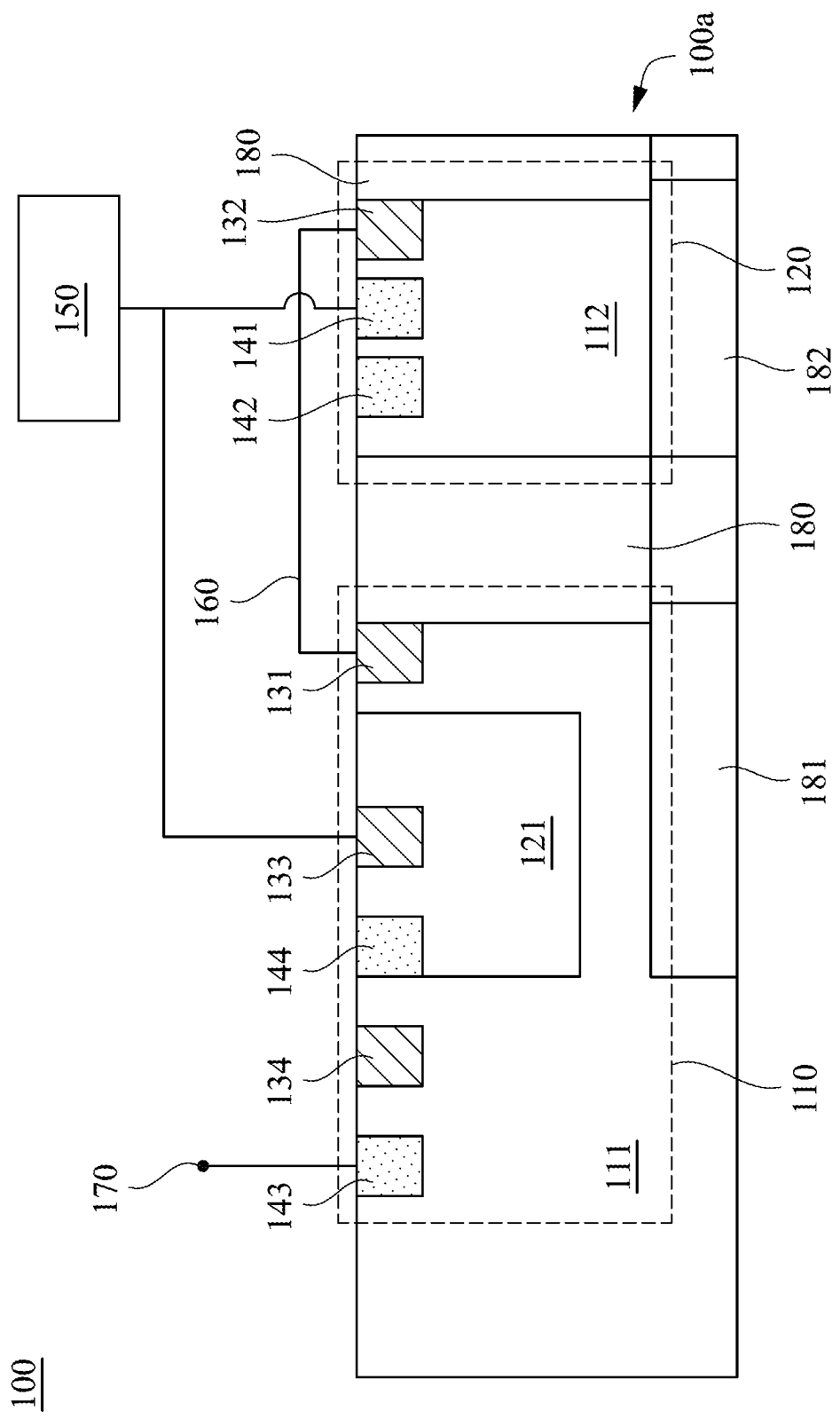
FIG. 1 illustrates a semiconductor structure 100 according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections.

According to various embodiments of the present invention, a semiconductor structure is provided for electrostatic discharge (ESD) protection, The ESD protection structure disclosed herein has a lower turn-on voltage, as compared to the conventional SCR devices. The detailed structure of the present invention is discussed below.

FIG. 1 is a cross-sectional view illustrating a semiconductor structure 100 according to an embodiment of the present invention. The semiconductor structure 100 includes a silicon control rectifier (SCR) region 110 and a NPN region 120. Both the SCR region 110 and the NPN region 120 are formed in a semiconductor substrate 100a.

The SCR region 110 includes a first p-well region 111, a first n-well region 121 and a first P+ region 131. The first n-well region 121 is surrounded by the first p-well region 111, and the first P+ region 131 is disposed in the first p-well region 111 and spaced apart from the first n-well region 121. Further, the first P+ region 131 is electrically connected to the p-well region 111.

In some embodiments, the SCR region 110 further includes a third P+ region 133 disposed in the first n-well region 121. The third P+ region 133 is electrically coupled to an electrostatic discharge source 150.

In some embodiments, the SCR region 110 may further include a third N+ region 143 disposed in the first p-well region 111. The third N+ region 143 is coupled to a ground node 170, in which the ground node 170 may be a conductive structure that may be considered as "zero volts".

In some embodiments, the SCR region 110 further includes a fourth P+ region 134 and a fourth N+ region 144 respectively disposed in the first p-well region 111 and the first n-well region 121, according to some embodiments of the present invention. The third N+ region 143, the fourth P+ region 134, the fourth N+ region 144 and the third P+ region 133 are arranged in order in the SCR region 110. Moreover, the first, second, third and fourth N+ region 141, 142, 143, 144 and the first, second, third and fourth P+ region 131, 132, 133, 134 are arranged at a top surface of the semiconductor substrate 100a.

The NPN region 120 is formed in the semiconductor substrate 100a and adjacent to the SCR region 110. The NPN region 120 includes a second p-well region 112, a first N+ region 141, a second N+ region 142 and a second P+ region 132.

The first N+ region 141 is coupled to the second p-well region 112. In examples, the first N+ region 141 is formed in the second p-well region 112. In addition, the first N+ region 141 is coupled to the electrostatic discharge source 150. For example, the N+ region 141 may be connected to the electrostatic discharge source 150 through a conductive trace or line made of metallic material. In some embodiments, the N+ region 141 may substantially equipotentially connected to the third P+ region 133. For example, the N+ region 141 may be connected to the third P+ region 133 through another conductive trace or line made of metallic material.

The second N+ region 142 is spaced apart from the first N+ region 141 and coupled to the second p-well region 112. Specifically, the second N+ region 142 may be formed in the second p-well region 112 at a position proximate the first N+ region 141. In some examples, the second N+ region 142 may be arranged between the first P+ region 131 and the first N+ region 141.

The second P+ region 132 is formed in the second p-well region 112 and substantially equipotentially connected to the first P+ region 131 formed in the first p-well region 111. In some embodiments, the semiconductor structure 100 may further include a conductive trace 160 that equipotentially interconnects the second P+ region 132 with the first P+ region 131. The conductive trace 160 may be formed on or in the semiconductor substrate 100a, and may comprise or be made of metallic material such as copper, aluminum and the like. The conductive trace 160 may be routed from the second P+ region 132 through a suitable region out of the SCR region 110 and/or the NPN region 120 to the first P+ region 131. Accordingly, the second P+ region 132 may be substantially equipotentially connected to the first P+ region 131

The semiconductor structure 100 further includes a second n-well region 180 disposed between the SCR region 110 and the NPN region 120 in some embodiments. The second n-well region 180 separates the first p-well region 111 of the SCR region 110 and the second p-well region 112 of the NPN region 120. It is noted that any number of n-well regions may be disposed between the SCR region 110 and the NPN region 120, depending on the demand. In some embodiments, the second n-well region 180 may be further formed in a region that is away from the first p-well region 111 and proximate the other side of the NPN region 120. In some embodiments, the second n-well region 180 may be disposed at both sides of the NPN region 120, as shown in FIG. 1.

In some embodiments, the semiconductor structure 100 may further include a deep n-well region 181 formed under the first p-well region 111. The first p-well region 111 may be completely separated from the NPN region 120 by the second n-well region 180 and the deep n-well region 181, according to some examples of the present invention. Since the first p-well region 111 is separated from the NPN region 120, the potentials of any of the regions in the SCR region 110 would not be affected by the NPN region 120.

In certain embodiments, the NPN region 120 may further include a deep n-well region 182 disposed under the second p-well region 112. The NPN region 120 is surrounded by the deep n-well region 182 and the second n-well region 180, so that the potentials of any of the regions in the NPN region 120 would not be affected by the SCR region 110.

Figure 2:
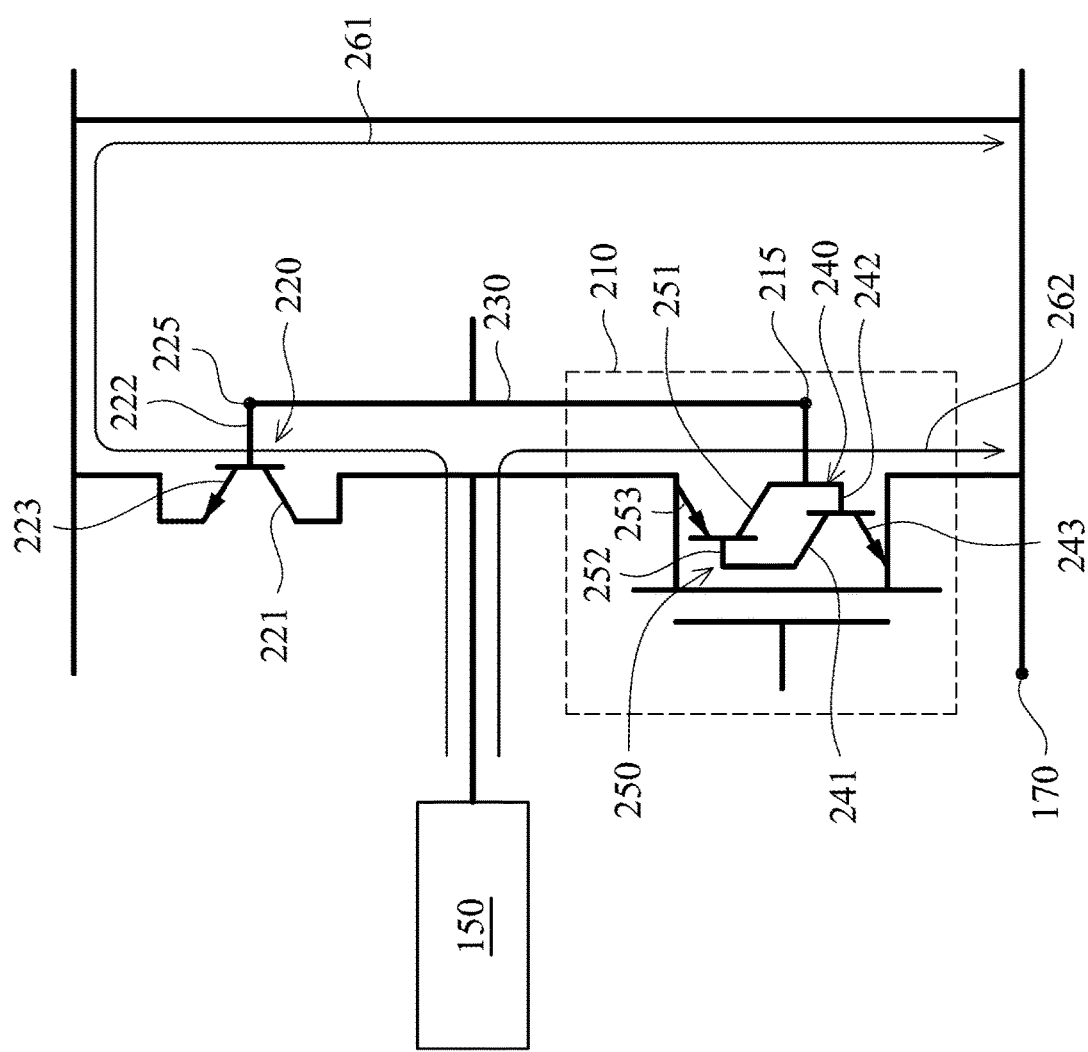
FIG. 2 illustrates an equivalent circuit diagram corresponding to the semiconductor structure 100.

FIG. 2 illustrates an equivalent circuit diagram corresponding to the semiconductor structure 100 illustrated in FIG. 1. With reference to FIG. 1 and FIG. 2, the SCR circuit 210 and the NPN transistor 220 illustrated in FIG. 2 respectively correspond to the SCR region 110 and the NPN region 120 in FIG. 1. The NPN transistor 220 includes a collector 221, an emitter 223 and a base 222. In detail, the collector 221, the emitter 223 and the base 222 of the NPN transistor 220 in FIG. 2 respectively correspond to the first N+ region 141, the second N+ region 142 and the second p-well region 112 in FIG. 1.

The SCR circuit 210 in FIG. 2 may include or consist of a NPN transistor 240 and a PNP transistor 250. The NPN transistor 240 of the SCR circuit 210 includes a collector 241, a base 242 and an emitter 243. The PNP transistor 250 of the SCR circuit 210 includes a collector 251, a base 252 and an emitter 253. The collector 241, the base 242 and the emitter 243 respectively correspond to the first n-well region 121, the first p-well region 111 and the third N+ region 143. On the other hand, the collector 251, the base 252 and the emitter 253 correspond to the first p-well region 111, the first n-well region 121 and the third P+ region 133, respectively. Thus, the base 242 of the NPN transistor 240 is coupled to the collector 251 of the PNP transistor 250, and the collector 241 of the NPN transistor 240 is coupled to the base 252 of the PNP transistor 250.

Furthermore, the node 215 in FIG. 2 corresponds to the first P+ region 131 in FIG. 1. Further, the node 225 in FIG. 2 corresponds to the second N+ region 132 in FIG. 1. The connection 230 in FIG. 2 corresponds to the conductive trace 160 in FIG. 1. The node 215 (e.g., first P+ region 131) is substantially equipotentially connected to the node 225 (e.g., the second N+ region 132 in FIG. 1) via the connection 230 (e.g., the conductive trace 160).

With reference to FIG. 1, when an electrostatic discharge occurs, the electrostatic discharge voltage/current is transmitted from the electrostatic discharge source 150 to the first N+ region 141. The first N+ region 141 therefore attracts the electrons in the second p-well region 112 so that the electrons gather around the first N+ region 141. Accordingly, it induces a higher voltage in the second p-well region 112, as compared with the second N+ region 142.

With reference to FIG. 2, once a voltage $V_B$ of the base 222 is greater than a voltage $V_E$ of the emitter 223, the NPN transistor 220 may be triggered. In examples, when the voltage $V_B$ is about 0.7 V greater than the voltage $V_E$, the NPN transistor 220 can be triggered. Particularly, while the electrostatic discharge is greater than about 5 V, the NPN transistor 220 may be triggered.

The base 222 is equipotentially coupled to the base 242 through the nodes 225 and 215. The voltage of the base 222 is substantially equal to that of the base 242. In other words, the higher voltage at the base 222 of the NPN transistor 220 may trigger the NPN transistor 240 in the SCR circuit 210. Once the NPN transistor 240 is triggered, the PNP transistor 250 is then triggered, too. Therefore, with the aid of the NPN region, the overall turn-on voltage of the semiconductor structure disclosed herein may be decreased to a level of about 5 V to about 15 V, such as 8 V to 11 V.

In a conventional SCR device which has no NPN transistor connected thereto, the turn-on voltage of the conventional SCR device is dominated by the avalanche breakdown voltage of the n-well/p-well junction of the SCR device. The turn-on voltage of the conventional SCR device is typically greater than about 20 V, and can not be used to protect low-voltage devices from damage of ESD. As compared to the conventional SCR device, the semiconductor structure disclosed herein has a relatively lower turn-on voltage, and may be used for the protection of low-voltage devices.

In some embodiments, the SCR region 110 and the NPN region 120 are configured to form a first electrostatic discharge current path (e.g., current path 261 illustrated in FIG. 2) from the electrostatic discharge source 150 to the third N+ region 143 through the second p-well region 112 of the NPN region 120. As shown in FIG. 2, the first electrostatic discharge current path 261 goes through the NPN transistor 220 to the ground node 170. When the ESD event occurs, the NPN transistor 220 will be turned on and the current is shunted to ground.

In certain embodiments, the SCR region 110 and the NPN region 120 are configured to form a second electrostatic discharge current path (e.g., current path 262 illustrated in FIG. 2) from the electrostatic discharge source 150 to the third N+ region 143 through the first n-well region 121 of the SCR region 110. Similar to the first electrostatic discharge current path 261, the second electrostatic discharge current path 262 goes through the SCR circuit 210 to the ground node 170. In other words, there are two electrostatic discharge current paths in the semiconductor structure of the present invention. Thus, the semiconductor structure of the present invention is more effective due to the two electrostatic discharge paths.

Figure 3:
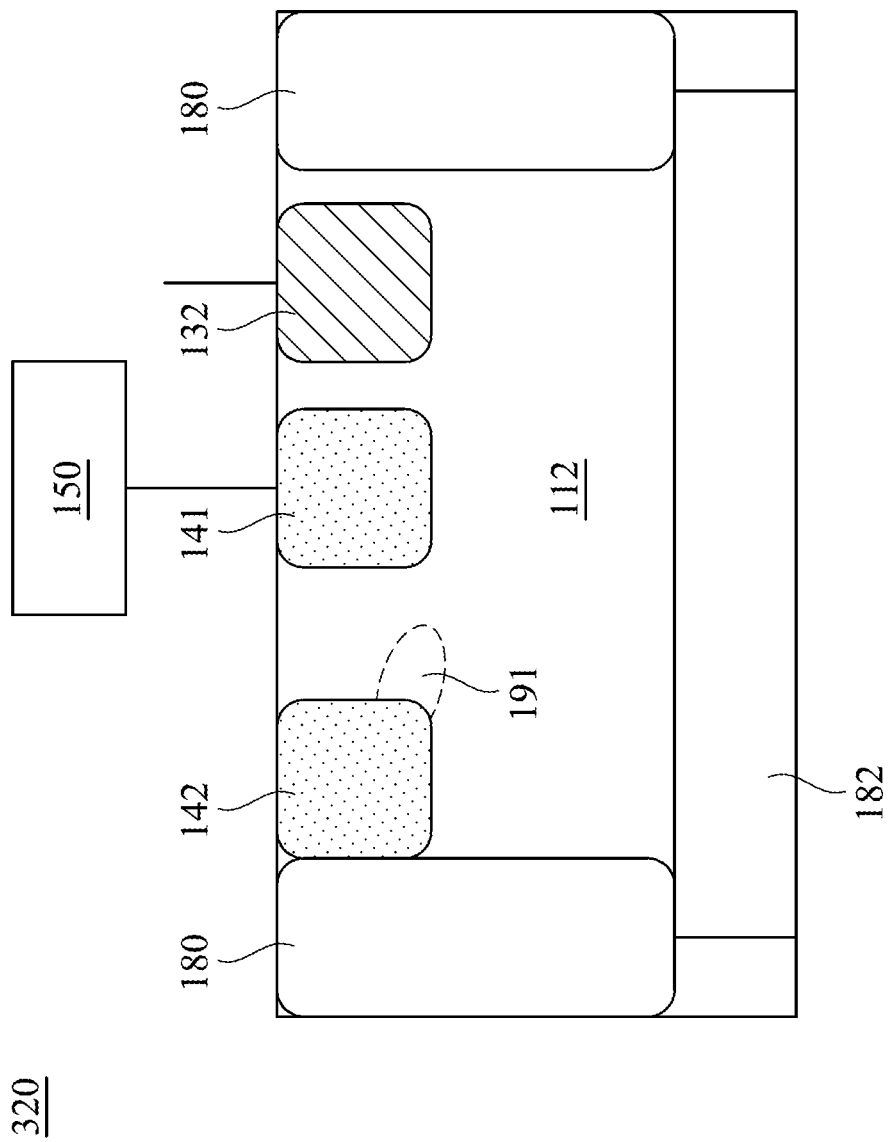
FIG. 3 illustrates a portion of a semiconductor structure according to an embodiment of the present invention.

Variations of the some embodiments of the NPN regions are discussed hereinafter. Throughout the various illustrative embodiments, like reference numbers are used to designate like elements. FIG. 3 illustrates a NPN region 320 which may replace the NPN region 120 shown in FIG. 1, according to another embodiment of the present invention. Unlike the NPN region 120 illustrated in FIG. 1, the NPN region 320 further includes a halo implant region 191, which may be referred to as a "pocket implant region", formed near the second N+ region 142. In specifics, the halo implant region 191 is in contact with the second N+ region 142. The conductivity type of the halo implant region 191 is different from that of the second N+ region 142. For example, the second N+ region 142 is n-type doped, while the halo implant region 191 is p-type doped. Due to the different conductivity types, the halo implant region 191 may increase the resistance of the second N+ region 142. The increased resistance of the second N+ region 142 increases the turn-on voltage of the NPN region 220. As a result, the overall turn-on voltage of the semiconductor structure is also increased. In the embodiments where the halo implant region 191 is formed adjacent to the second N+ region 142, the overall turn-on voltage of semiconductor structure may be increased to about 10 V to about 15 V, such as 11 V, 12 V, 13 V or 14 V.

Figure 4:
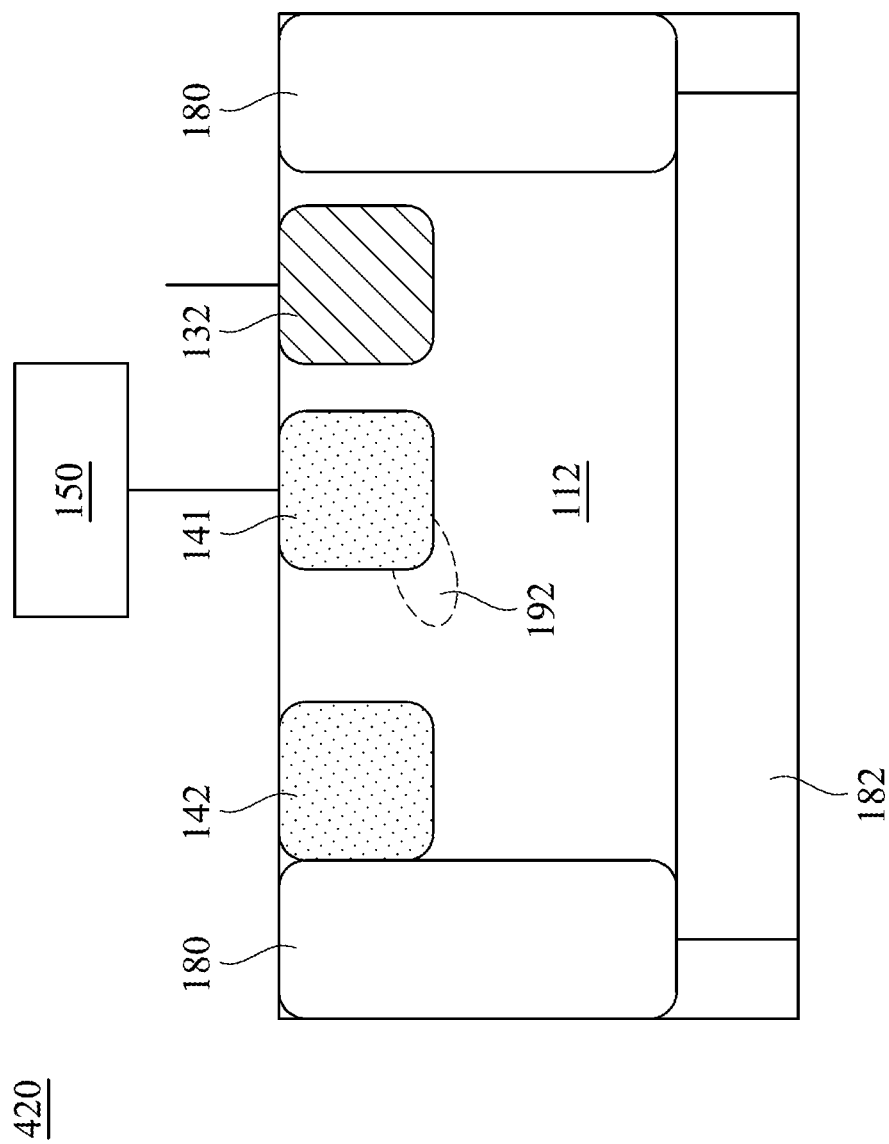
FIG. 4 illustrates a portion of a semiconductor structure according to an embodiment of the present invention.

FIG. 4 illustrates a NPN region 420 of the semiconductor structure according to still another embodiment of the present invention. The NPN region 420 further includes a halo implant region 192 formed near the first N+ region 141 and in contact with the first N+ region 141. As mentioned above, the halo implant region 192 may increase the resistance of the first N+ region 141. The increased resistance of the first N+ region 141 may decrease the turn-on voltage of the NPN region 320, resulting in the decrease in the overall turn-on voltage of the semiconductor structure. The overall turn-on voltage of semiconductor structure may be decreased to about 5 V to about 10 V, such as 6 V, 7 V, 8 V or 9 V.

Furthermore, the doping concentrations of the halo implant regions 191, 192 are less than the second p-well region 112, thus the halo implant regions 191, 192 may be also referred as "P− regions".

The semiconductor structure provided herein may have a low turn-on voltage of about 5 V to about 15 V. Thus, the semiconductor structure may be used in the circuit including low-voltage devices. Further, the present invention also provides the semiconductor structure with the halo implant region in the NPN region. With the halo implant region, the turn-on voltage may be tuned to fit the demand.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
   a silicon control rectifier (SCR) region formed in a semiconductor substrate, and comprising:
   a first p-well region;
   a first n-well region surrounded by the first p-well region; and
   a first P+ region in the first p-well region and spaced apart from the first n-well region;
   a NPN region formed in the semiconductor substrate and adjacent to the SCR region, and comprising:
   a second p-well region;
   a first N+ region coupled to the second p-well region and an electrostatic discharge source;
   a second N+ region coupled to the second p-well region and spaced apart from the first N+ region; and
   a second P+ region in the second p-well region and equipotentially connected to the first P+ region in the first p-well region.

2. The semiconductor structure of claim 1, wherein the SCR region further comprises a third P+ region disposed in the first n-well region and coupled to the electrostatic discharge source.

3. The semiconductor structure of claim 2, wherein the third P+ region is equipotentially connected to the first N+ region.

4. The semiconductor structure of claim 1, wherein the NPN region further comprises a first halo implant region directly coupled to the first N+ region, wherein the first halo implant region is p-type.

5. The semiconductor structure of claim 1, wherein the NPN region further comprises a second halo implant region directly coupled to the second N+ region, wherein the second halo implant region is p-type.

6. The semiconductor structure of claim 1, further comprising a second n-well region disposed between the SCR region and the NPN region.

7. The semiconductor structure of claim 1, further comprising a metal line equipotentially interconnecting the second P+ region with the first P+ region.

8. The semiconductor structure of claim 1, wherein the SCR region further comprises a third N+ region disposed in the first p-well region and coupled to a ground node.

9. The semiconductor structure of claim 8, wherein the SCR region and the NPN region are configured to form a first electrostatic discharge (ESD) current path from the electrostatic discharge source to the third N+ region through the second p-well region of the NPN region.

10. The semiconductor structure of claim 8, wherein the SCR region and the NPN region are configured to form a second electrostatic discharge (ESD) current path from the electrostatic discharge source to the third N+ region through the first n-well region of the silicon control rectifier (SCR) region.

* * * * *